United States Patent
Baudot et al.

(10) Patent No.: US 9,257,518 B2
(45) Date of Patent: Feb. 9, 2016

(54) METHOD FOR PRODUCING A METAL-GATE MOS TRANSISTOR, IN PARTICULAR A PMOS TRANSISTOR, AND CORRESPONDING INTEGRATED CIRCUIT

(71) Applicant: STMicroelectronics (Crolles 2) SAS, Crolles (FR)

(72) Inventors: Sylvain Baudot, Odars (FR); Pierre Caubet, Le Versoud (FR); Florian Domengie, Crolles (FR)

(73) Assignee: STMicrolectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/254,994

(22) Filed: Apr. 17, 2014

(65) Prior Publication Data

US 2014/0319616 A1    Oct. 30, 2014

(30) Foreign Application Priority Data

Apr. 24, 2013 (FR) .................................... 13 53728

(51) Int. Cl.

| H01L 21/00 | (2006.01) |
|---|---|
| H01L 29/423 | (2006.01) |
| H01L 27/088 | (2006.01) |
| H01L 21/8234 | (2006.01) |
| H01L 21/28 | (2006.01) |
| H01L 29/49 | (2006.01) |
| H01L 29/78 | (2006.01) |

(52) U.S. Cl.
CPC .... *H01L 29/42372* (2013.01); *H01L 21/28079* (2013.01); *H01L 21/28088* (2013.01); *H01L 21/8234* (2013.01); *H01L 27/088* (2013.01); *H01L 29/4966* (2013.01); *H01L 29/78* (2013.01)

(58) Field of Classification Search
CPC ... H01L 29/78; H01L 27/088; H01L 29/4232; H01L 29/1079; H01L 29/7393; H01L 29/42372; H01L 21/28088; H01L 29/4966; H01L 29/66477
USPC ........... 257/288, 368, 369; 438/151, 197, 199
See application file for complete search history.

(56) References Cited

U.S. PATENT DOCUMENTS

| 5,169,796 A * | 12/1992 | Murray ........... H01L 21/823814 148/DIG. 3 |
|---|---|---|
| 2001/0030125 A1 | 10/2001 | D'Couto et al. |
| 2007/0161233 A1* | 7/2007 | Seok ................. H01L 21/02063 438/638 |
| 2009/0004850 A1* | 1/2009 | Ganguli ................. C23C 16/18 438/655 |
| 2010/0133623 A1 | 6/2010 | Inumiya et al. |

(Continued)

OTHER PUBLICATIONS

INPI Search Report and Written Opinion for FR1353728 mailed Jan. 9, 2014 (8 pages).

(Continued)

*Primary Examiner* — Jarrett Stark
*Assistant Examiner* — Shahed Ahmed
(74) *Attorney, Agent, or Firm* — Gardere Wynne Sewell LLP

(57) ABSTRACT

At least one MOS transistor is produced by forming a dielectric region above a substrate and forming a gate over the dielectric region. The gate is formed to include a metal gate region. Formation of the metal gate region includes: forming a layer of a first material configured to reduce an absolute value of a threshold voltage of the transistor, and configuring a part of the metal gate region so as also to form a diffusion barrier above the layer of the first material. Then, doped source and drain regions are formed using a dopant activation anneal.

18 Claims, 3 Drawing Sheets

(56) References Cited

U.S. PATENT DOCUMENTS

| | | |
|---|---|---|
| 2010/0320547 A1 | 12/2010 | Ando et al. |
| 2011/0163452 A1 | 7/2011 | Horii et al. |
| 2011/0195549 A1 | 8/2011 | Chuang et al. |
| 2012/0256274 A1* | 10/2012 | Riess ............... H01L 29/66545 257/408 |
| 2013/0264620 A1* | 10/2013 | Yu .................... H01L 23/53238 257/295 |
| 2013/0299912 A1* | 11/2013 | Kim ..................... H01L 27/088 257/368 |
| 2014/0024208 A1* | 1/2014 | Frank ............... H01L 21/28052 438/592 |
| 2014/0117417 A1* | 5/2014 | Bazizi ............... H01L 29/66628 257/288 |
| 2014/0131809 A1* | 5/2014 | Ando ................ H01L 21/02697 257/369 |
| 2014/0306295 A1* | 10/2014 | Kim ..................... H01L 29/517 257/401 |

OTHER PUBLICATIONS

Ramanuja N. et al: "Synthesis and Characterization of Low Pressure Chemically Vapor Deposited Titanium Nitride Films Using TiCl4 and NH3," Materials Letters, North Holland Publishing Company, Amsterdam, NL, vol. 57, No. 2, Dec. 1, 2002, pp. 261-269.

* cited by examiner

METHOD FOR PRODUCING A METAL-GATE MOS TRANSISTOR, IN PARTICULAR A PMOS TRANSISTOR, AND CORRESPONDING INTEGRATED CIRCUIT

PRIORITY CLAIM

This application claims priority from French Application for Patent No. 1353728 filed Apr. 24, 2013, the disclosure of which is hereby incorporated by reference.

TECHNICAL FIELD

The invention relates to integrated circuits, and in particular to the production of metal-gate MOS transistors.

BACKGROUND

An MOS transistor, whether an NMOS or PMOS transistor, conventionally has source and drain regions as well as a gate insulated from the substrate by a dielectric region, commonly referred to by the person skilled in the art by the term "gate oxide".

Doped polysilicon has for a long time been used as a gate material, in particular for the 120 nm to 450 nm technology nodes. As a semiconductor material, its Fermi level is adjustable throughout the bandgap of silicon by implantation of dopants, which makes it possible to adjust the desired electrical characteristics, in particular the threshold voltage.

Originally, silicon dioxide ($SiO_2$) was used as the gate oxide. With technical development, however, the thickness of the gate oxide is decreasing, the effect of which is to increase the tunneling leakage current. It has therefore been necessary to use a gate oxide with a higher dielectric permittivity. This is the reason why the gate oxide was firstly nitrided in order to become silicon oxynitride (SiON), which makes it possible to increase its dielectric constant.

However, transistors having polysilicon gates as well as gate oxides formed by SiON have a high leakage current associated with a phenomenon of depletion of the polysilicon, which leads to high threshold voltages for the transistors.

It was then envisaged to insert, between the silicon oxynitride and the polysilicon gate, a material with high permittivity (referred to as a "high-K" material) having dielectric constants K of more than 10.

This makes it possible to reduce the tunneling leakage current but leaves remaining the problem of the phenomenon of depletion of the polysilicon gate, therefore still leading to a high threshold voltage.

In order to reduce the threshold voltage of the transistor, it is then proposed, in particular for technology nodes of 28 nanometers and less, to replace the polysilicon gate with a metal layer of a "mid-gap" material, that is to say one whose work function lies substantially between the level of the conduction band of silicon and the level of the valence band of silicon.

There are principally two solutions for producing a metal gate.

A first solution consists in depositing the dielectric region/metal gate stack after production of the doped source and drain regions and the dopant activation anneal. This is a so-called "gate last" architecture, according to the terminology well known to the person skilled in the art.

This makes it possible to widen the range of possible metals having a high work function in order to adjust the characteristics of the device. On the other hand, such a manufacturing method is significantly more complex and the design rules of the circuits are more constringent.

Another solution consists in producing the metal gate before production of the doped source and drain regions and the dopant activation anneal. Such an architecture is referred to as "gate first", according to terminology well known to the person skilled in the art.

Such an architecture simplifies the manufacture and design of the circuits. However, it means that the gate/dielectric stack undergoes the dopant activation anneal at more than 1000° C. This is a major constraint which limits the choice of the materials. By way of nonlimiting example, the pairing TiN/HfSiON has been adopted for its thermal stability, titanium nitride having a work function of close to 4.6 eV when it is annealed at more than 1000° C.

Such a gate stack thus makes it possible to reduce the leakage current and avoid the phenomenon of depletion, which makes it possible to reduce the threshold voltage of the transistor.

SUMMARY

According to one embodiment, it is proposed to further reduce the absolute value of the threshold voltage of a transistor, that is to say to reduce the positive threshold voltage of an NMOS transistor or increase the negative threshold voltage of a PMOS transistor.

In this regard, it has been observed that the presence of a local potential variation (or dipole) in the dielectric region of the transistor, due to addition of a specific material in the region of the metal gate, for example aluminum for a PMOS transistor or lanthanum for an NMOS transistor, makes it possible to reduce the absolute value of the threshold voltage of the transistor. This being the case, it is observed that, in gate architectures of the "gate first" type, the quantity of aluminum for example, or lanthanum for example, finally present in the dielectric region was much less than the quantity of the same material introduced into the metal gate region during the manufacturing process. Furthermore, the cause of this problem has been identified as being due to the dopant activation anneal, which causes diffusion of the atoms of this material not only to the dielectric region but also to the upper region of the gate.

Consequently, it is proposed to configure a part of the metal gate region so as also to form a diffusion barrier above the material layer intended to reduce the absolute value of the threshold voltage of the transistor.

Thus, according to one aspect, a method is provided for producing at least one MOS transistor, for example an NMOS transistor or a PMOS transistor, comprising: formation of doped source and drain regions involving a dopant activation anneal and, prior to the formation of source and drain regions, formation of a dielectric region above a substrate and formation of a gate, involving formation of a metal gate region.

This, in particular, is therefore a gate architecture of the "gate first" type.

According to a general characteristic of this aspect, the formation of the metal gate region comprises: formation of a layer of a first material, for example aluminum in the case of a PMOS transistor or lanthanum in the case of an NMOS transistor, intended to reduce the absolute value of the threshold voltage of the transistor, and configuration of a part of the metal gate region so as also to form a diffusion barrier above the layer of the first material.

Thus, the combination of the layer of the first material and the diffusion barrier makes it possible to limit or prevent any diffusion of the first material to the upper region of the metal gate and to concentrate this diffusion in the direction of the dielectric region. Moreover, it is a part of the metal gate region which is configured in order to form this diffusion barrier, so as to preserve the gate properties of the gate material.

Thus, according to one embodiment, a first metal gate layer formed above the layer of the first material is configured as a diffusion barrier.

Furthermore, this first metal gate layer, the thickness of which is by way of indication of the order of several tens of angstroms, for example between 20 and 40 angstroms, is for example a layer of titanium nitride having a density of more than 4.5 g/cm$^3$, preferably more than 4.8 g/cm$^3$, and typically equal to 4.9 g/cm$^3$.

Such a titanium nitride density may be obtained by physical vapour deposition at a pressure of the order of 10 mTorr, whereas titanium nitride is usually deposited at a pressure of 3 mTorr.

Although the initial layer of titanium nitride has been densified in order to reach, for example, a density of 4.9 g/cm$^3$, and thus form the diffusion barrier, the titanium nitride densified in this way preserves its gate material properties, and in particular its work function which is of the order of 4.6 eV.

Furthermore, the chemical composition of the titanium nitride densified in this way is not modified in relation to the initial titanium nitride. Thus, by way of indication, the percentage of nitrogen in the titanium nitride is of the order of from 51 to 52% atomic.

Furthermore, the stress of the titanium nitride densified in this way is modified little in relation to that of conventional titanium nitride, and therefore remains compatible with that of a gate material. By way of indication, the value of this compressive stress is of the order of −1.5 to −2.5 GPa.

As indicated above, the at least one MOS transistor may be a PMOS transistor.

In this case, by way of nonlimiting example, the formation of the dielectric region may comprise formation of an interface layer having a silicon oxide, for example SiON, surmounted by a dielectric material with high permittivity, for example hafnium silicon oxynitride (HfSiON) or hafnium dioxide (HfO$_2$). Furthermore, the formation of the metal gate region then advantageously comprises formation of an initial metal layer of titanium nitride above the dielectric region, formation of an aluminum layer as the layer of the first material above the initial metal layer, and formation of the barrier layer of titanium nitride having a density of more than 4.5 g/cm$^3$, for example 4.9 g/cm$^3$, above the layer of the first material.

The initial layer of titanium, although not indispensable, is advantageous because it makes it possible to further limit leakage currents, which is beneficial in certain applications.

According to one embodiment, at least one NMOS transistor may be produced in conjunction with the PMOS transistor, also involving: formation of doped source and drain regions, including the dopant activation anneal, and, prior to the formation of the source and drain regions, formation of a dielectric region, as well as formation of a gate above the dielectric region involving formation of a metal gate region, including formation of a layer of a second material, for example a layer of lanthanum, intended to reduce the absolute value of the threshold voltage of the NMOS transistor.

The formation of the metal gate region of the NMOS transistor may also comprise the formation of at least one second metal gate layer, for example of titanium nitride, above the layer of second material, for example lanthanum.

The formation of the metal gate region of the PMOS transistor then comprises formation above the first metal gate layer, that is to say the one forming the diffusion barrier, of the second material layer, for example lanthanum, surmounted by the second metal gate layer, that is to say another layer of titanium nitride.

According to another aspect, an integrated circuit is provided, comprising at least one MOS transistor having a dielectric region arranged above a substrate, and a gate located above the dielectric region and having a metal gate region.

According to a general characteristic of this other aspect, the metal gate region has a layer of a first material intended to reduce the absolute value of the threshold voltage of the transistor, the dielectric region incorporates a quantity of the first material, for example aluminum, and a part of the metal gate region is configured in order also to form a diffusion barrier above the layer of the first material.

According to one embodiment, the metal gate region comprises, above the layer of the first material, a first metal gate layer configured in order to form the diffusion barrier, for example densified titanium nitride having a density of the order of for example 4.9 g/cm$^3$ while having a work function of the order of 4.6 eV, and a percentage of nitrogen of the order of from 51 to 52% atomic and a compressive stress of the order of from −1.5 to −2.5 GPa.

When the transistor is a PMOS transistor, the metal gate region may comprise an initial metal gate layer of titanium nitride above the dielectric region (formed, for example, by a silicon oxide surmounted by a dielectric material with high permittivity), a layer of aluminum as the layer of the first material above the initial metal layer and the barrier layer of densified titanium nitride with a density of more than 4.5 g/cm$^3$.

The PMOS transistor then comprises, for example, an aluminum concentration peak at the interface between the dielectric material with high permittivity and the initial metal gate layer of titanium nitride.

Furthermore, the dose of aluminum in the dielectric material with high permittivity is advantageously more than 10$^{15}$ at/cm$^2$.

According to one embodiment, the integrated circuit furthermore comprises at least one NMOS transistor having a gate above a dielectric region, the gate having a metal gate region including a layer of a second material intended to reduce the absolute value of the threshold voltage of the NMOS transistor and at least one second metal gate layer, and the metal gate region of the at least one PMOS transistor comprises above the first metal gate layer, the layer of the second material surmounted by the second metal gate layer.

The layer of the second material may be a layer of lanthanum, and the second metal gate layer may be a layer of titanium nitride.

BRIEF DESCRIPTION OF THE DRAWINGS

Other advantages and characteristics of the invention will become apparent on studying the detailed description of embodiments, which do not imply any limitation, and the appended drawings, in which.

DETAILED DESCRIPTION OF THE DRAWINGS

Figure 1:
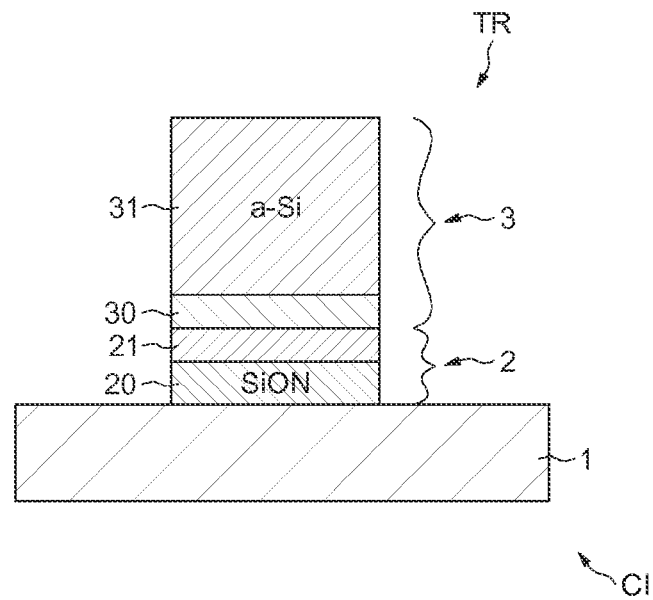
FIGS. 1 to 6 relate to various embodiments of the method and of production of an integrated circuit.
Figure 2:
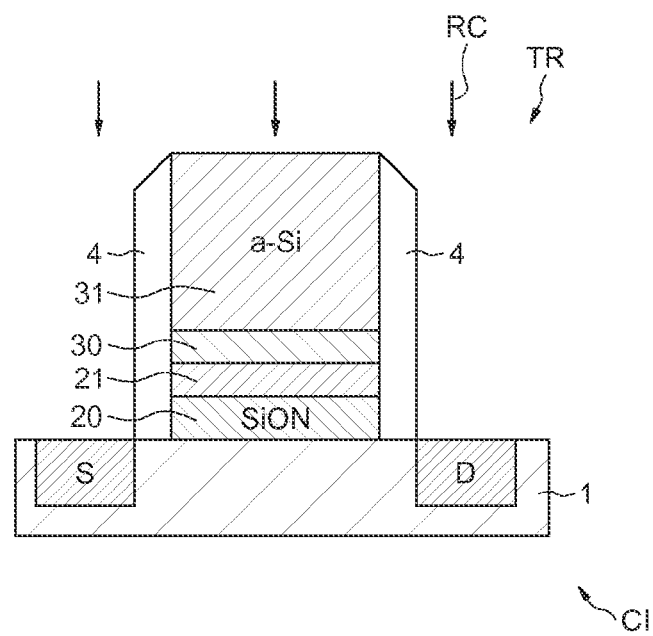

FIGS. 1 and 2 schematically illustrate an example of production of a metal gate of the "gate first" architecture type, of a transistor TR, whether this transistor is an NMOS or PMOS transistor.

More precisely, above a semiconductor substrate 1 of a wafer, a dielectric region 2 is formed which is composed here of an interface layer 20, for example of silicon oxynitride SiON, surmounted by a layer of a material with high permittivity (high-K), the dielectric constant K of which is for example more than 10. This material 21 may be hafnium silicon oxynitride (HfSiON).

Next, a stack formed by metal, generally surmounted by amorphous silicon, is formed on the dielectric region 2.

After etching the stack formed in this way, the structure illustrated in FIG. 1 is obtained, that is to say a metal gate region 30 surmounted generally by a gate region 31 having amorphous silicon (a-Si), the regions 30 and 31 forming the gate 3 of the transistor TR.

Next, as illustrated in FIG. 2, insulating lateral regions 4 (spacers) are produced on the sides of the gate 3, and implantation of dopants is carried out on either side of the gate so as to form source regions S and drain regions D. This operation is followed by a dopant activation anneal RC, generally carried out at a temperature of more than 1000° C., for example 1050° C.

The subsequent steps in the production of the transistor are conventional and known per se, and will not be described in detail here.

Figure 3:
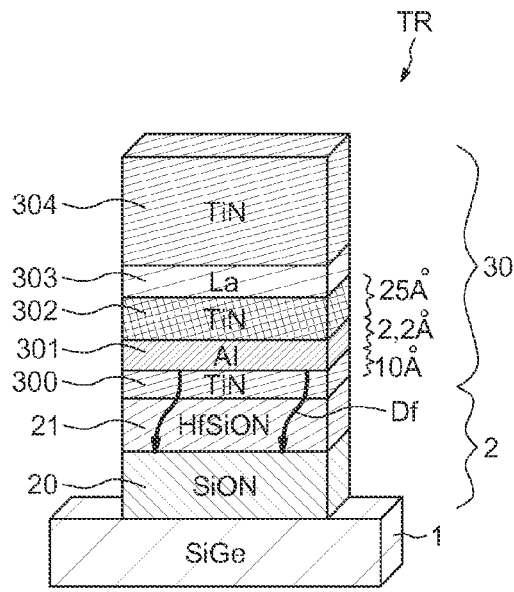

Reference is now made more particularly to FIG. 3 in order to illustrate in more detail an example of formation of the metal gate region 30 of the transistor TR.

It is assumed in the example illustrated in FIG. 3 that the transistor TR is a PMOS transistor of an integrated circuit CI produced in a 28 nm technology, of the bulk substrate type or of the silicon-on-insulator type (SOI), for example of the fully depleted silicon-on-insulator type (FD SOI: Fully Depleted SOI).

In order to form the metal gate region 30, an initial metal layer, for example of titanium nitride 300, is firstly formed on the dielectric region 2, and more particularly on the material 21 with high permittivity. This formation may be carried out in a conventional way by physical vapor deposition at a pressure of the order of 3 mTorr. This layer 300 may, for example, have a thickness of the order of 10 angstroms.

Next, a layer of aluminum 301 is deposited, which is intended as will be seen in more detail below to reduce the absolute value of the threshold voltage of the transistor. The thickness of this aluminum layer may typically be of the order of a few angstroms, for example 2.2 angstroms.

Next, a metal layer 302 forming a diffusion barrier, and formed here by TiN densified in relation to the TiN of the layer 300, is deposited on the layer of aluminum 301.

The thickness of this layer forming a diffusion barrier is, for example, of the order of 25 angstroms.

The density of the TiN of the layer 302 is more than the density of a conventional layer of TiN such as the layer 300, that is to say 4.5 g/cm$^3$. The density is preferably more than 4.8 g/cm$^3$, for example equal to 4.9 g/cm$^3$.

This layer of denser TiN may be obtained by plasma vapor deposition with modified pressure conditions.

Figure 4:
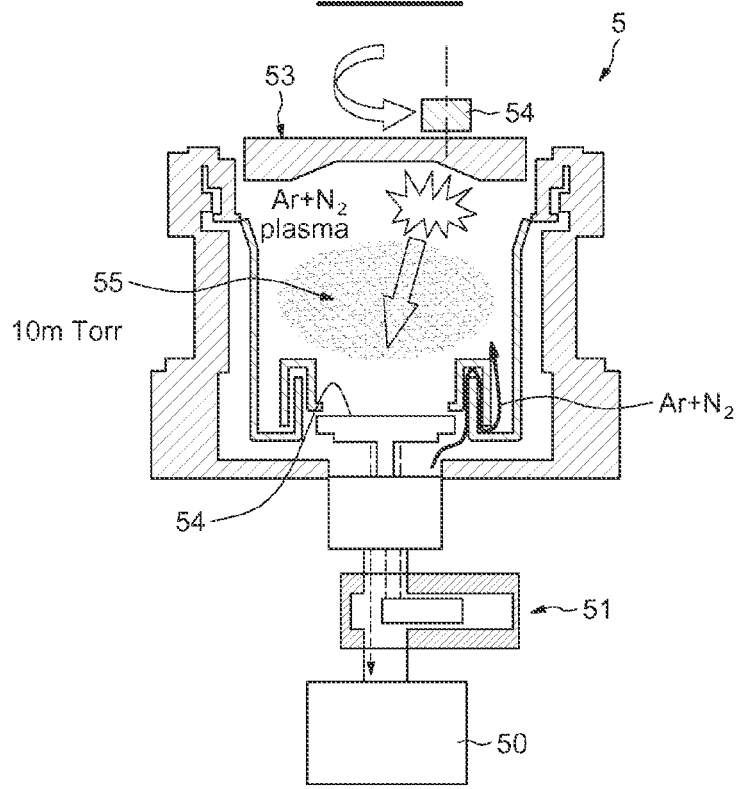

More precisely, as illustrated in FIG. 4, the wafer 54 on which the layer 302 will be deposited is placed in a reactor 5 equipped with a pump 50 and a valve 51. A titanium target 53 and a rotating magnet 54 are arranged at the other end of the reactor. A flow of argon Ar, for example with a flow rate of 20 sccm ("standard cubic centimeters per minute", that is to say 20 cm$^3$/min under the following standard conditions: 0° C. and 101.325 kPa) and of nitrogen N$_2$, for example with a flow rate of 45 sccm, is introduced into the chamber and bombards the target 53. The DC power is for example 700 W, and the RF power is for example 600 W. The titanium nitride is then deposited on the wafer 54 (the flow rates and powers given above by way of example correspond to a reactor intended to process wafers with a diameter of 300 mm; the person skilled in the art will of course know how to adapt them for reactors intended to process wafers having a different diameter). In relation to the conventional conditions for deposition of a layer of titanium nitride, the pressure in the chamber 55 is in this case 10 mTorr (obtained for example by adjusting the position of the valve) whereas it is conventionally 3 mTorr. Furthermore, the temperature of the substrate is of the order of 20° C. This is because it has been observed that such conditions make it possible to increase the density of a 25 angstrom layer in order to reach of the order of 4.9 to 5 g/cm$^3$. An excessive increase in the pressure, for example 15 mTorr, would have led to degradation of the TiN formed.

Furthermore, it is worth pointing out that this TiN layer densified in this way preserves its gate material properties, namely a work function of the order of 4.6 eV, a proportion of nitrogen of the order of from 51 to 52% atomic, and a compressive stress of the order of from −1.5 to −2.5 GPa.

Although this is not indispensable, the formation of the metal gate region 30 of the PMOS transistor TR of FIG. 3 is followed by the formation, above the layer 302, of a layer 303 of lanthanum, itself surmounted by a layer 304 of conventional titanium nitride, for example having a thickness of the order of 65 angstroms. This is because, as will be seen in more detail below, these two layers 303 and 304 derive from the combined formation of NMOS transistors on the wafer.

After dopant activation annealing, the aluminum contained in the layer 301 diffuses essentially (arrows Df in FIG. 3) of the dielectric region 2 because of the presence of the diffusion barrier 302.

This being the case, after this anneal, a residue of aluminum layer 301 nevertheless remains in the metal gate region 30, between the two layers 300 and 302 of TiN.

Figure 5:
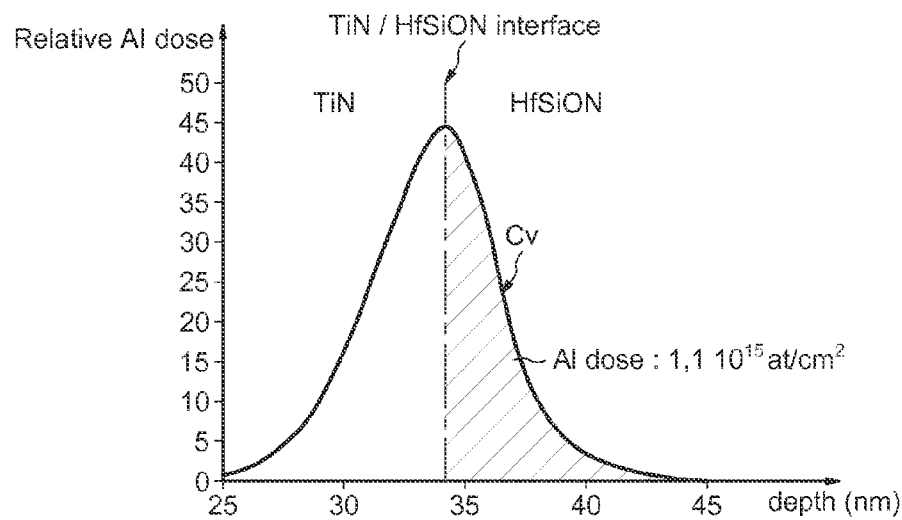

Furthermore, as shown by the curve CV of FIG. 5, the presence of this diffusion barrier above the layer 301 is manifested, in the transistor TR produced, by the presence of an aluminum peak at the interface between the titanium nitride TiN of the layer 300 and the hafnium silicon oxynitride 21 of the dielectric region 2. Furthermore, the aluminum dose in the dielectric region is more than 10$^{15}$ atoms/cm$^2$, and equal in this example to 1.1 10$^{15}$ atoms/cm$^2$.

It has furthermore been shown that the presence of the diffusion barrier 302 made it possible to reduce the absolute value of the threshold voltage of the transistor by the order of 60 mV.

Figure 6:
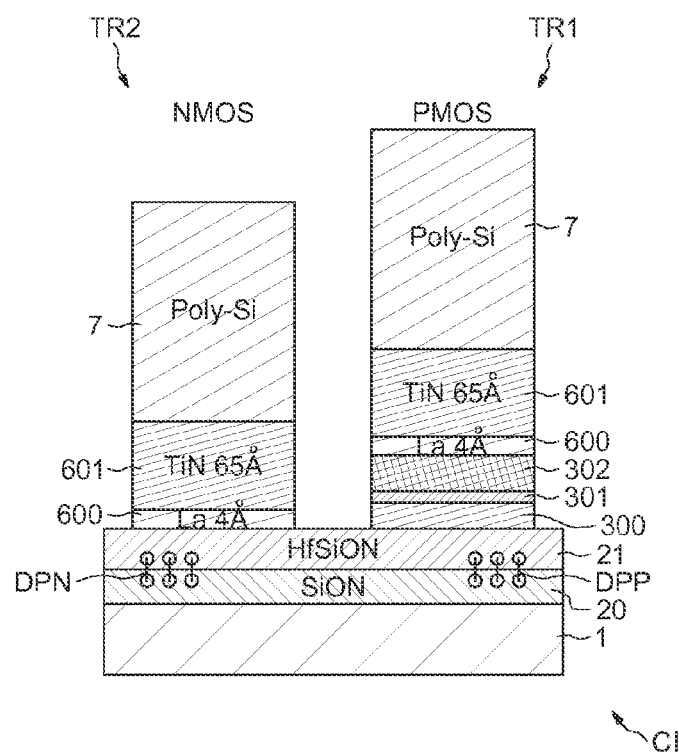

It is of course possible, as illustrated in FIG. 6, to produce NMOS transistors TR2 and PMOS transistors TR1 together on the same wafer.

In this regard, after having formed the dielectric region 20, 21 on the substrate 1 of the integrated circuit, the stack of layers 300, 301 and 302 is formed on all of the wafer above the dielectric region. This stack of layers, which is intended for the PMOS transistor, is then removed at the positions in which the gates of the NMOS transistors will need to be produced. Then, on all of the wafer, that is to say on the dielectric region 20, 21 as regards the NMOS transistors and on the layer 302 as regards the PMOS transistors, a layer 600 formed by a material intended to lower the absolute value of the threshold voltage of the NMOS transistor is deposited, in this case a layer of lanthanum La, for example 4 angstroms, surmounted by a conventional layer of titanium nitride TiN 601, for example with a thickness of 65 angstroms.

All of this is then covered with a layer of polysilicon 7.

Furthermore, after a dopant activation anneal, at the interface between the silicon oxynitride and the material with high relative permittivity, there are aluminum dipoles DPP under the gate of the PMOS transistor and lanthanum dipoles DPN under the gates of the NMOS transistors.

The invention is not limited to the embodiments which have just been described, but encompasses all variants thereof.

Thus, it would be possible to form a diffusion barrier above the lanthanum layer in order to produce the NMOS transistors, for example also from densified titanium nitride.

Furthermore, although aluminum has been described as the material intended to reduce the absolute value of the threshold voltage of a PMOS transistor, it would have been possible to use the following materials: Rh, Re, Ni, Au, Pd, Ir, Ru, Os, Pt, etc.

Likewise, as regards the NMOS transistors, it would have been possible to use the following materials instead of lanthanum La: Zr, Ti, Cr, Mo, Ag, Co.

Lastly, the titanium nitride could be replaced with another mid-gap metal, for example copper or tungsten.

What is claimed is:

1. A method for producing a MOS transistor, comprising:
    forming a dielectric region above a substrate;
    forming a gate above the dielectric region, wherein forming the gate comprises:
        forming a metal gate region comprising:
            forming a layer of a first material configured to reduce an absolute value of a threshold voltage of the MOS transistor, and
            configuring a part of the metal gate region so as to form a first metal gate layer as a diffusion barrier above the layer of the first material, wherein the first metal gate layer is a layer of titanium nitride having a density of more than 4.8 g/cm$^3$; and
    forming doped source and drain regions by performing a dopant activation anneal.

2. The method according to claim 1, wherein a thickness of the first metal gate layer is between 20 and 40 angstroms.

3. The method of claim 1, wherein the density of the layer of titanium nitride is approximately equal to 4.9 g/cm$^3$.

4. The method according to claim 1, wherein forming the titanium nitride layer comprises performing a physical vapor deposition at a pressure of the order of 10 mTorr.

5. The method according to claim 1, wherein a work function of the titanium nitride layer is on the order of 4.6 eV and a percentage of nitrogen in the titanium nitride layer is on the order of from about 51% atomic to about 52% atomic.

6. The method according to claim 1, wherein the MOS transistor is a PMOS transistor.

7. The method according to claim 6, wherein forming the dielectric region comprises forming an interface layer having a silicon oxide, surmounted by a dielectric material with high permittivity, and
    wherein forming the metal gate region comprises:
        forming an initial metal layer of titanium nitride above the dielectric region having a density of about 4.5 g/cm$^3$,
        forming an aluminum layer as the layer of the first material above the initial metal layer, and
        forming the diffusion barrier of titanium nitride having the density of more than 4.8 g/cm$^3$ above the layer of the first material.

8. The method according to claim 7, further comprising producing at least one NMOS transistor comprising:
    forming of another dielectric region, and
    forming another gate above the another dielectric region comprising:
        forming another metal gate region, including:
            forming a layer of a second material configured to reduce an absolute value of a threshold voltage of the NMOS transistor, and
            forming at least one second metal gate layer above the layer of second material, and
    wherein forming the metal gate region of the at least one PMOS transistor comprises forming the layer of the second material on the aluminum layer of the first material and below the diffusion barrier.

9. The method according to claim 8, wherein the layer of the second material is a layer of lanthanum, and the second metal gate layer is a layer of titanium nitride.

10. A method for producing a MOS transistor, comprising:
    forming a gate stack comprising:
        depositing a first layer of titanium nitride on a dielectric region above a semiconductor substrate;
        depositing a layer of aluminum on the first layer of titanium nitride;
        depositing a second layer of titanium nitride on the layer of aluminum, wherein the second layer of titanium nitride is denser than the first layer of titanium nitride; and
        depositing a layer of amorphous silicon above the second layer of titanium nitride;
    forming lateral spacers on sidewalls of the gate stack;
    implanting dopants into the semiconductor substrate on each side of the gate stack to form source and drain regions; and
    performing a dopant activation anneal which further diffuses material of the layer of aluminum toward the dielectric region.

11. The method of claim 10, wherein forming the gate stack further comprises:
    depositing a layer of lanthanum on the second layer of titanium nitride;
    depositing a third layer of titanium nitride on the layer of lanthanum; and
    depositing said layer of amorphous silicon on the third layer of titanium nitride.

12. The method of claim 10, wherein the second layer of titanium nitride has a density of about 4.5 g/cm$^3$.

13. The method of claim 12, wherein the second layer of titanium nitride has a density of more than 4.8 g/cm$^3$.

14. The method of claim 13, wherein the second layer of titanium nitride has a density approximately equal to 4.9 g/cm$^3$.

15. The method of claim 10, wherein a work function of the second layer of titanium nitride is on the order of 4.6 eV and a percentage of nitrogen in the second layer of titanium nitride is on the order of from about 51% atomic to about 52% atomic.

16. The method of claim 10, wherein the MOS transistor is a PMOS transistor.

17. A method for producing an NMOS transistor and a PMOS transistor, comprising:
    forming a dielectric region above a semiconductor substrate;
    in a first region for the PMOS transistor:
        depositing a first layer of titanium nitride on the dielectric region; and
        depositing a layer of aluminum on the first layer of titanium nitride;
    in a second region for the NMOS transistor and in the first region for the PMOS transistor:
        depositing a layer of lanthanum, said layer of lanthanum in contact with the layer of aluminum in the first region and the dielectric region in the second region;

depositing a second layer of titanium nitride on the layer of lanthanum, wherein the second layer of titanium nitride is denser than the first layer of titanium nitride; and depositing a layer of amorphous silicon above the second layer of titanium nitride;

patterning the deposited layers to form a first gate stack in the first region and a second gate stack in the second region;

forming lateral spacers on sidewalls of the first and second gate stacks;

implanting dopants into the semiconductor substrate on each side of the gate stack to form source and drain regions; and performing a dopant activation anneal which further diffuses material of the layer of aluminum toward the dielectric region in the first region for the PMOS transistor.

18. The method of claim 17, wherein the density of the first layer of titanium nitride is approximately equal to 4.5 g/cm$^3$ and the density of the first layer of titanium nitride is in excess of 4.8 g/cm$^3$.

\* \* \* \* \*